United States Patent
Malisic et al.

(10) Patent No.: US 11,650,893 B2
(45) Date of Patent: May 16, 2023

(54) MULTIPLE NAME SPACE TEST SYSTEMS AND METHODS

(71) Applicant: Advantest Corporation, Tokyo (JP)

(72) Inventors: Srdjan Malisic, San Jose, CA (US); Chi Yuan, San Jose, CA (US)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 17/193,668

(22) Filed: Mar. 5, 2021

(65) Prior Publication Data

US 2021/0303429 A1 Sep. 30, 2021

Related U.S. Application Data

(60) Provisional application No. 63/002,998, filed on Mar. 31, 2020.

(51) Int. Cl.
*G11C 29/56* (2006.01)
*G06F 11/27* (2006.01)
*G06F 12/02* (2006.01)

(52) U.S. Cl.
CPC .......... *G06F 11/27* (2013.01); *G06F 12/0238* (2013.01); *G06F 2212/202* (2013.01)

(58) Field of Classification Search
CPC ............... G06F 11/27; G06F 12/0238; G06F 2212/202; G06F 11/2736; G06F 11/2247; G06F 11/2273; G06F 11/26; G11C 29/56016; G11C 29/48; G11C 29/1201; G11C 29/26; G11C 2029/1206; G11C 2029/2602; G11C 2029/5602

USPC .......................................................... 714/734
See application file for complete search history.

(56) References Cited

U.S. PATENT DOCUMENTS

| | | | |
|---|---|---|---|
| 6,671,844 B1* | 12/2003 | Krech, Jr. .............. | G11C 29/56 714/736 |
| 7,184,917 B2* | 2/2007 | Pramanick ......... | G01R 31/3183 702/108 |
| 7,848,899 B2* | 12/2010 | Lai ................... | G01R 31/31707 714/25 |

(Continued)

FOREIGN PATENT DOCUMENTS

| CN | 101073016 A | 11/2007 |
|---|---|---|
| CN | 103038751 A | 4/2013 |

(Continued)

*Primary Examiner* — Albert DeCady
*Assistant Examiner* — Enam Ahmed

(57) ABSTRACT

Presented embodiments facilitate efficient and effective flexible implementation of different types of testing procedures in a test system. In one embodiment, a multiple-name-space testing system comprises a load board, testing electronics, and a namespace testing tracker. The load board is configured to couple with a plurality of devices under test (DUTs). The testing electronics are configured to test the plurality of DUTs, wherein the testing electronics are coupled to the load board. The controller is configured to direct testing of multiple-name-spaces across the plurality of DUTs at least in part in parallel. The controller can be coupled to the testing electronics. The namespace testing tracker is configured to track testing of the plurality of DUTs, including the testing of the multiple-name-spaces across the plurality of DUTs at least in part in parallel. In one embodiment, the DUTs are NVMe SSD devices.

19 Claims, 6 Drawing Sheets

(56) References Cited

U.S. PATENT DOCUMENTS

| | | | | |
|---|---|---|---|---|
| 7,930,601 | B2* | 4/2011 | Eckelman | G11C 29/12015 714/719 |
| 8,726,112 | B2* | 5/2014 | Rajski | G01R 31/318547 714/731 |
| 8,872,531 | B2* | 10/2014 | Song | G11C 29/56012 714/724 |
| 2004/0068699 | A1* | 4/2004 | Morris | G01R 31/31915 714/733 |
| 2008/0049514 | A1* | 2/2008 | Mondello | G11C 29/48 365/185.22 |
| 2010/0023294 | A1* | 1/2010 | Fan | G01R 31/318513 702/123 |
| 2010/0192135 | A1* | 7/2010 | Krishnaswamy | G01R 31/318307 717/140 |
| 2011/0161762 | A1* | 6/2011 | Whetsel | G01R 31/31723 714/E11.02 |
| 2013/0138383 | A1* | 5/2013 | Filler | G06F 11/2733 702/123 |
| 2015/0058691 | A1* | 2/2015 | Olgaard | H04L 43/50 714/734 |
| 2018/0189159 | A1 | 7/2018 | Carmichael et al. | |
| 2019/0353696 | A1 | 11/2019 | Hsu et al. | |
| 2020/0033408 | A1 | 1/2020 | Rogel-Favila et al. | |
| 2020/0272548 | A1* | 8/2020 | Carrington | G06F 11/261 |

FOREIGN PATENT DOCUMENTS

| | | |
|---|---|---|
| CN | 105144114 A | 12/2015 |
| CN | 109582520 A | 4/2019 |
| CN | 110502374 A | 11/2019 |
| CN | 110504002 A | 11/2019 |
| CN | 110618903 A | 12/2019 |
| KR | 20160129695 A | 11/2016 |
| TW | 200535440 A | 11/2005 |
| TW | 201833570 A | 9/2018 |
| TW | 201840996 A | 11/2018 |

* cited by examiner

300

310
Configuring testing electronics to test the plurality of DUTs, wherein the testing electronics are coupled to the load board.

320
Directing testing of a multiple namespaces across the plurality of DUTs at least in part in parallel.

330
Tracking testing of the plurality of DUTs, including the testing of the multiple namespaces across the plurality of DUTs at least in part in parallel.

FIG. 3

MULTIPLE NAME SPACE TEST SYSTEMS AND METHODS

RELATED APPLICATIONS

This application claims the benefit of and priority to provisional application 63/002,998 entitled Multiple-Name-Space Test Systems and Methods filed Mar. 31, 2020, which is incorporated herein by reference.

FIELD OF THE INVENTION

The present invention relates to the field of electronic testing.

BACKGROUND OF THE INVENTION

Electronic systems and devices have made a significant contribution towards the advancement of modern society and have facilitated increased productivity and reduced costs in analyzing and communicating information in a variety of business, science, education, and entertainment applications. Conventional testing systems and methods often have various limitations.

Traditional electron devices (e.g., memory devices, data storage components, Solid State Drives (SSDs), etc.) can have any number of namespaces (e.g., associated with partitions, etc.) per drive. A data storage drive can have 100,000 namespaces for instance. In traditional test systems, typically only one namespace can be tested at a time per device under test (e.g., electronic device, SSD, data storage drive, etc.). This results in the overall testing being very slow.

SUMMARY

Presented embodiments facilitate efficient and effective flexible implementation of different types of testing procedures in a test system. In one embodiment, a multiple-name-space testing system comprises a load board, testing electronics, and a namespace testing tracker. The load board is configured to couple with a plurality of devices under test (DUTs). The testing electronics are configured to test the plurality of DUTs, wherein the testing electronics are coupled to the load board. The controller is configured to direct testing of multiple-name-spaces across the plurality of DUTs at least in part in parallel. The controller can be coupled to the testing electronics. The namespace testing tracker is configured to track testing of the plurality of DUTs, including the testing of the multiple-name-spaces across the plurality of DUTs. In one embodiment, the DUTs are Non-Volatile Memory Express (NVMe) Solid State Drive (SSDs) devices.

In one embodiment, the controller can handle user introduced testing requirements. The requirements can include a user indication that a namespace is to be tested with acceleration features (e.g., full acceleration, hardware acceleration, Field Programmable Gate Array (FPGA) acceleration, etc.) and an indication that another namespace is to be tested normally. The controller can direct sets of namespaces testing in parallel. Multiple-name-spaces (e.g., 128, 512, etc.) can be tested in parallel across a plurality of devices. In one exemplary implementation, up to 128 devices are tested at least in part simultaneously. The controller can be configured to handle user introduced testing requirements that further complicate the tracking and management of the testing. The namespace testing tracker can track and manage testing of multiple-name-spaces at a time per DUT.

It is appreciated that multiple-name-space testing systems and methods can include artificial intelligence that assists the testing. In one embodiment, a multiple-name-space testing system comprises a load board, testing electronics, a controller, and a namespace testing tracker that includes intelligence. The namespace testing tracker is configured to track testing of the plurality of DUTs, including the testing of the multiple-name-spaces across the plurality of DUTs at least in part in parallel. In one embodiment, the namespace testing tracker includes intelligence configured to select namespaces for testing based on various factors, including characteristics of the namespaces and application of test features of the test equipment/electronics.

In one embodiment, a multiple-name-space testing method comprises: configuring testing electronics to test the plurality of DUTs, wherein the testing electronics are coupled to the load board; directing testing of multiple-name-spaces across the plurality of DUTs at least in part in parallel; and tracking testing of the plurality of DUTs. The tracking testing can include tracking the testing of the multiple-name-spaces across the plurality of DUTs at least in part in parallel.

In one embodiment, the directing includes testing control based upon differences in namespace characteristics (e.g., sector size, protection information, etc.). In one exemplary implementation, the directing includes application of test features of the test equipment/electronics to devices under test (e.g., normal testing, fully accelerated, etc.). The directing can include directing sets of namespaces testing in parallel or concurrently as least in part. Multiple-name-spaces can be tested in parallel across a plurality of devices.

In one embodiment, user introduced testing requirements are handled, including an indication that a namespace is to be tested with full FPGA hardware acceleration while another namespace is to be tested normally. User introduced testing requirements that further complicate the tracking and management of the testing can be handled. In one embodiment, the overall test time is compressed.

DESCRIPTION OF THE DRAWINGS

The accompanying drawings, which are incorporated in and form a part of this specification, are included for exemplary illustration of the principles of the present invention and not intended to limit the present invention to the particular implementations illustrated therein. The drawings are not to scale unless otherwise specifically indicated.

FIG. 3 is a flow chart of an exemplary multiple-name-space test method in accordance with one embodiment

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Presented embodiments enable efficient and effective testing of devices under test (DUTs) with a plurality of namespaces over multiple devices. In one embodiment the DUTs are storage devices. Multiple-name-space test systems and methods can test the DUTs at least in part concurrently or in parallel. Multiple namespaces (e.g., 4, 8, 24, etc.) can be tested in parallel across a plurality of devices. In one exemplary implementation, there can be many devices tested simultaneously (e.g., up to 128, 192, etc.). In one embodiment, the multiple-name-space test systems and methods can track and manage testing of multiple namespaces at a time per drive. In one exemplary implementation, multiple-name-space testing systems and methods can handle user introduced testing requirements that further complicate the tracking and management of the testing.

Figure 1:
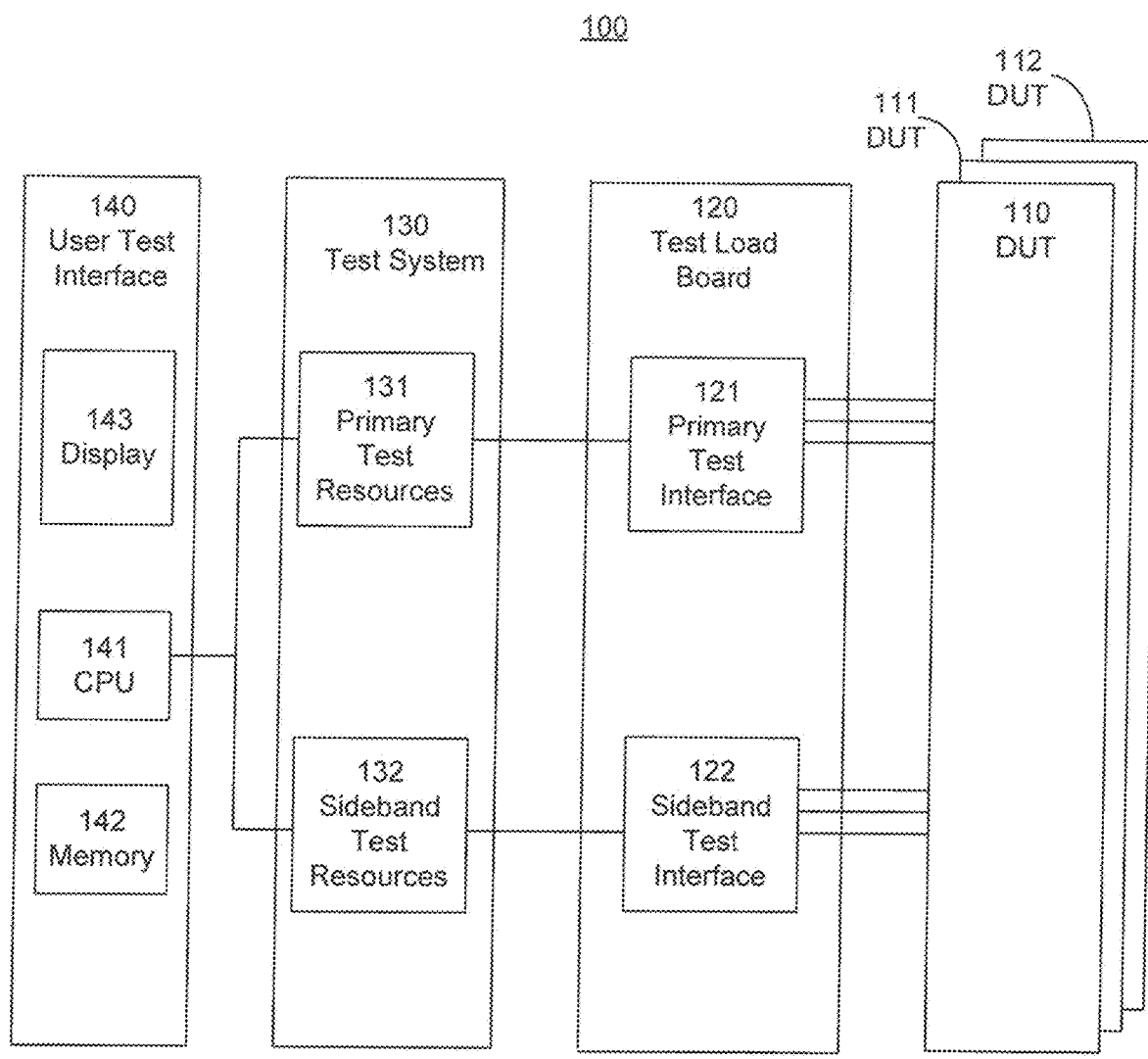
FIG. 1 is a block diagram of an exemplary test environment or system in accordance with one embodiment.

FIG. 1 is a block diagram of an exemplary test environment or system 100 in accordance with one embodiment. The test environment or system 100 includes devices under test (DUT) (e.g., 110, 111, 112, etc.), test or load board 120, test equipment 130, and user test interface 140. The DUTs (e.g., 110, 111, 112, etc.) are coupled to the test load board 120 which is coupled to test equipment 130, which in turn is coupled to the CPU 141. In one embodiment, the test load board 120 includes primary or persistent test interface 121 and sideband interface 122, Load board 120 is configured to electrically and physically couple the DUTs to the test equipment 130. Test equipment 130 direct and controls testing of the DUTs and includes resources that are assigned to the respective DUTs. In one exemplary implementation, resources are assigned to DUT 110 as primary test resources 131 and sideband resources 132. Test equipment 130 can include a Field Programmable Gate Array (FPGA). In one embodiment, test various information (e.g., test results, preliminary analysis results, reconfigured test information, testing directions, etc.) is communicated between test equipment 130 and user test interface 140. User test interface 140 includes processing unit 141, memory 142, and display 143. Memory 142 can store testing related information, processing unit 141 can process the information, and display 143 can display the information.

Figure 2:
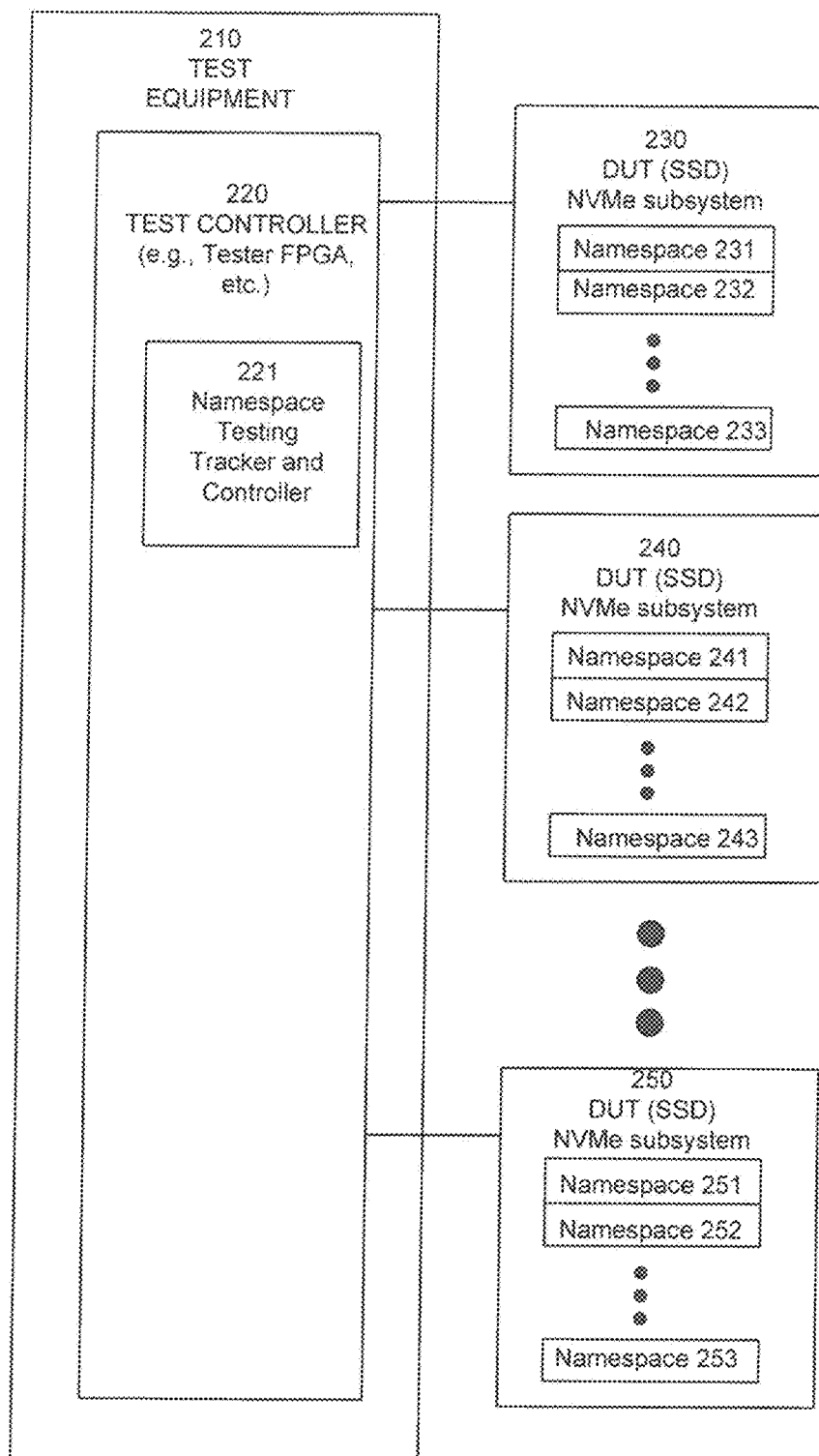
FIG. 2 is a block diagram of an exemplary multiple-name-space test system in accordance with one embodiment.

FIG. 2 is a block diagram of an exemplary multiple-name-space test system 200 in accordance with one embodiment. Multiple-name-space test system 200 includes test equipment 210 coupled to multiple devices under test (e.g., DUT 230, DUT 240, DUT 290, etc.). In one embodiment, test system 200 is similar to test environment system 100. Test equipment 210 includes test controller 220 configured to control testing of the multiple DUTs. Test controller 220 includes namespace testing tracker and controller 221 configured to track namespace information and control testing on a namespace basis. In one embodiment, namespace testing tracker and controller 221 is configured to track namespace test results on a namespace basis. The multiple devices under test (e.g., DUT 230, DUT 240, DUT 290, etc.) can be solid state devices (SSDs). In one exemplary implementation, the multiple devices under test (e.g., DUT 230, DUT 240, DUT 290, etc.) can include non-volatile memory express compatible subsystems. DUT 230 includes multiple-name-spaces (e.g., namespace 231, 232, 239, etc.). DUT 240 includes multiple-name-spaces (e.g., namespace 241, 242, 249, etc.). DUT 250 includes multiple-name-spaces (e.g., namespace 251, 252, 259, etc.).

In exemplary implementation, namespace testing tracker and controller 221 tracks and controls the order in which namespaces are tested. The namespaces can be tested in non-consecutive order. The namespaces can be tested in an order based upon user input. In exemplary implementation, namespace testing tracker and controller 221 tracks and controls the testing of namespaces and ensures all namespaces in a DUT are tested.

In one embodiment, sets of namespaces are tested in parallel. Multiple namespaces (e.g., 4, 8, 24, etc.) can be tested in parallel across a plurality of devices. In one exemplary implementation, 4 namespaces are tested in parallel in a first group or set, and then another 4 namespaces are tested in a second group or set, and so on. The groups can be tested in a round robin fashion. The multiple-name-space testing systems and methods can cope with a user indicating that a namespace is to be tested with full FPGA hardware acceleration and while another namespace is tested normally.

In one embodiment, namespaces are assigned to a test equipment segment. Test equipment can have multiple segments (e.g., 4 segments, 8 segments, etc.). In one exemplary implementation, a test equipment segment is controlled by a single control component. A control component can be configured to handle testing of a large number of DUTs (e.g., 16, 24, etc.). In one embodiment, 16 NVMe devices can be tested concurrently or substantially in parallel. A DUT can include a significant number of namespaces (e.g., 256, 1,000, etc.). In one exemplary implementation, a DUT can have up to 256 namespaces. The configuration can be directed to various testing functions/tasks. A large number of interrupts (e.g., 512, 1,024, etc.) coming from the DUTs can be balanced. In one exemplary implementation, the balancing can be based on a DUT's activity, number of CPUs (e.g., 64, 128, etc.) cores available, and so on. In one exemplary implementation, up to 512 interrupts coming from 16 DUTS are balanced based on activities of the 16 DUTs and availability of up to 64 processing cores. Power up, enumeration, and power down for a large number of DUTs can be handled within a short test time. In one exemplary implementation, the test time is shorted by a factor of 10 compared to traditional test times. A control component can manage a work queue and avoid deadlocking. Persistent namespace resources can be pre-allocated to quickly activate DUT's during power up and deactivate DUTs during power down. In one exemplary implementation, the DUT activation time is shorted by a factor of 100 compared to traditional test times.

In one embodiment, the control component includes a single software instance. The software instance can be a single LINUX instance. The LINUX software can be specifically configured to perform control component functions. In one exemplary implementation, persistent namespace software resources are pre-allocated In one embodiment, the multiple-name-space testing systems and methods also enable efficient and effective testing control for numerous differences in namespace characteristics (different sector sizes, different protection information, etc.).

In one embodiment, additional intelligence can be introduced to the namespace tracking and testing management. The intelligence can be directed at implementing more automated participation during namespace tracking and testing management. (e.g., selection of namespace testing order, selection of test equipment features to utilize, etc.). The intelligent selection can include consideration of various factors, including characteristics of the namespaces (different sector sizes, different protection information, etc.) and test equipment features (e.g., normal testing, fully accelerated, etc.), and so on. In one embodiment, intelligent selection can include making a correlation between characteristics of the namespaces and test equipment features and directing control of testing accordingly. In one exemplary implementation, testing of a namespace corresponding to a larger size or amount of memory is assigned to be tested by hardware acceleration testing features of the test equipment and another namespace corresponding to a smaller size or amount of memory is assigned to be tested by normal testing features of the test equipment.

FIG. 3 is a block diagram of an exemplary multiple-namespace test method in accordance with one embodiment.

In block 310, testing electronics are configured to test the plurality of DUTs, wherein the testing electronics are coupled to the load board. The DUTs can be NVMe SSD devices.

In block 320, testing of multiple-name-spaces across the plurality of DUTs is directed and controlled at least in part in parallel. In one embodiment, the directing includes control of differences in namespace characteristics (e.g., sector size, protection information, etc.). In one exemplary implementation, the directing includes application of test features to devices (e.g., normal testing, fully accelerated, etc.), and so on. The directing can include directing sets of namespaces testing in parallel. Multiple-name-spaces can be tested in parallel across a plurality of devices.

In one embodiment, user introduced testing requirements are handled, including indicating that a namespace is to be tested with full FPGA hardware acceleration while another namespace is to be tested normally. User introduced testing requirements that further complicate the tracking and management of the testing can be handled.

In block 330, testing of the plurality of DUTs is tracked. In one embodiment, the testing of the multiple-name-spaces across the plurality of DUTs is tracked. In one exemplary implementation overall test time is compressed.

Figure 4:
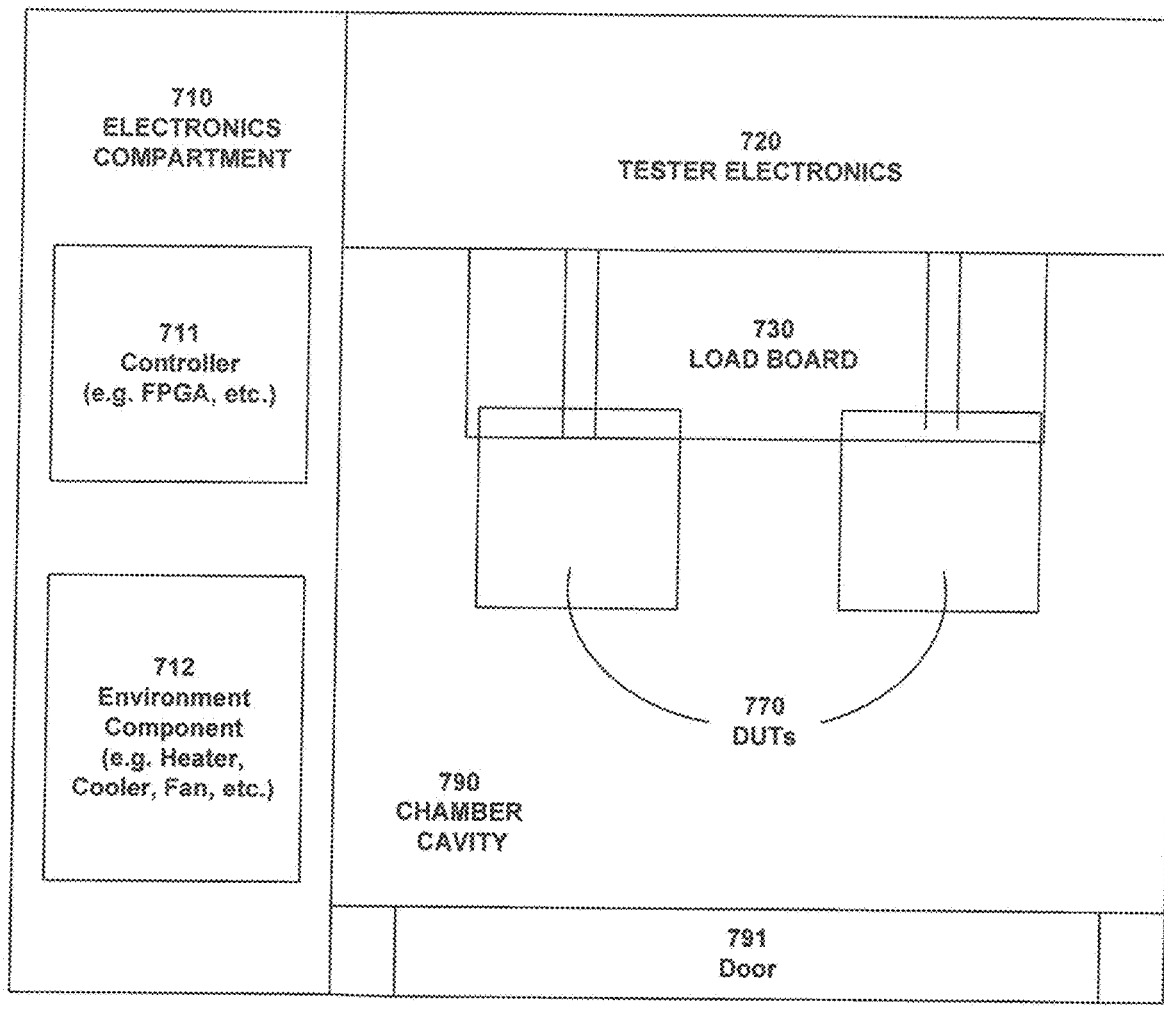
FIG. 4 is a block diagram of an exemplary testing system in accordance with one embodiment.
Figure 5:
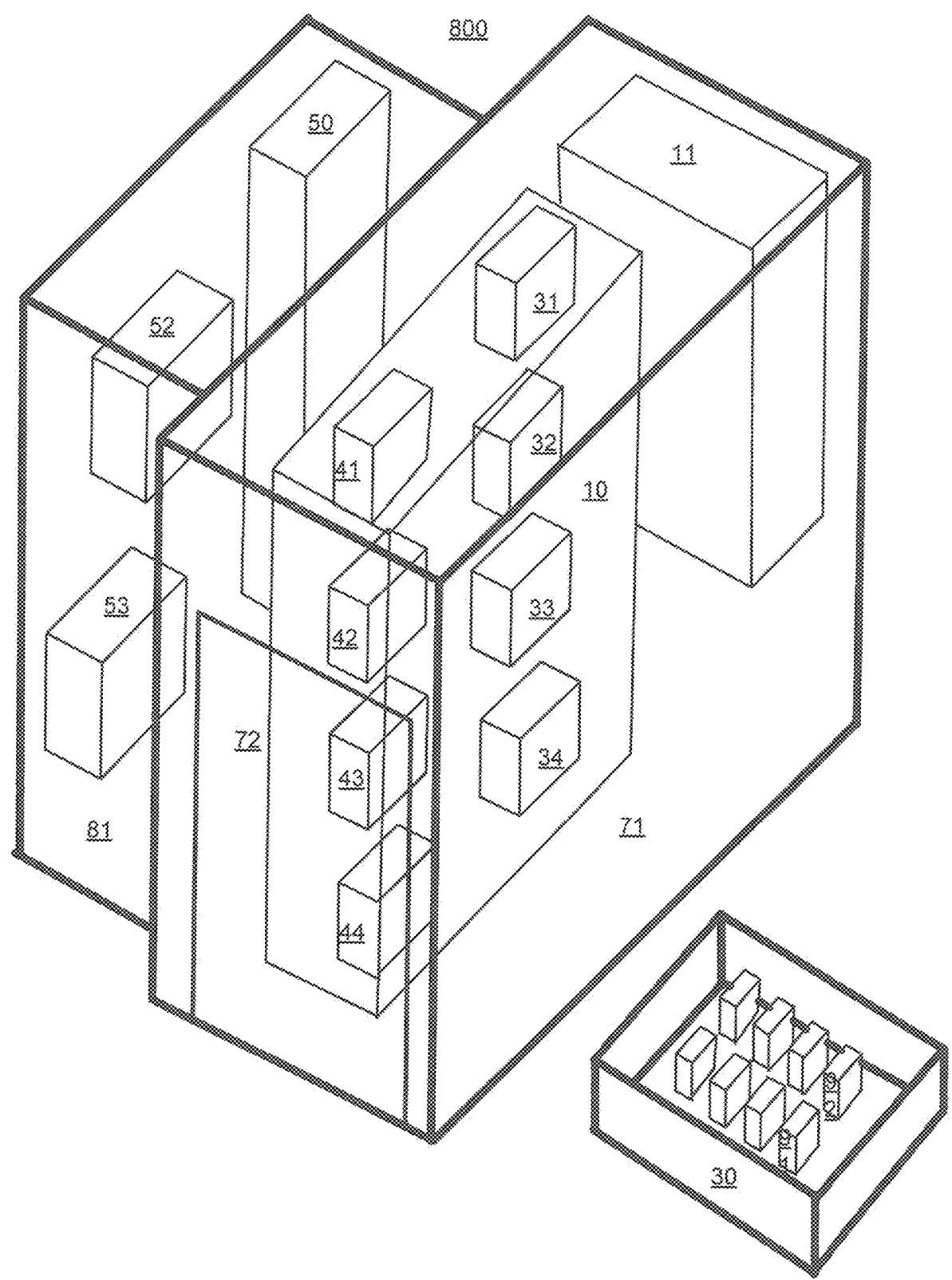
FIG. 5 is a block diagram of an exemplary testing system in accordance with one embodiment.
Figure 6:
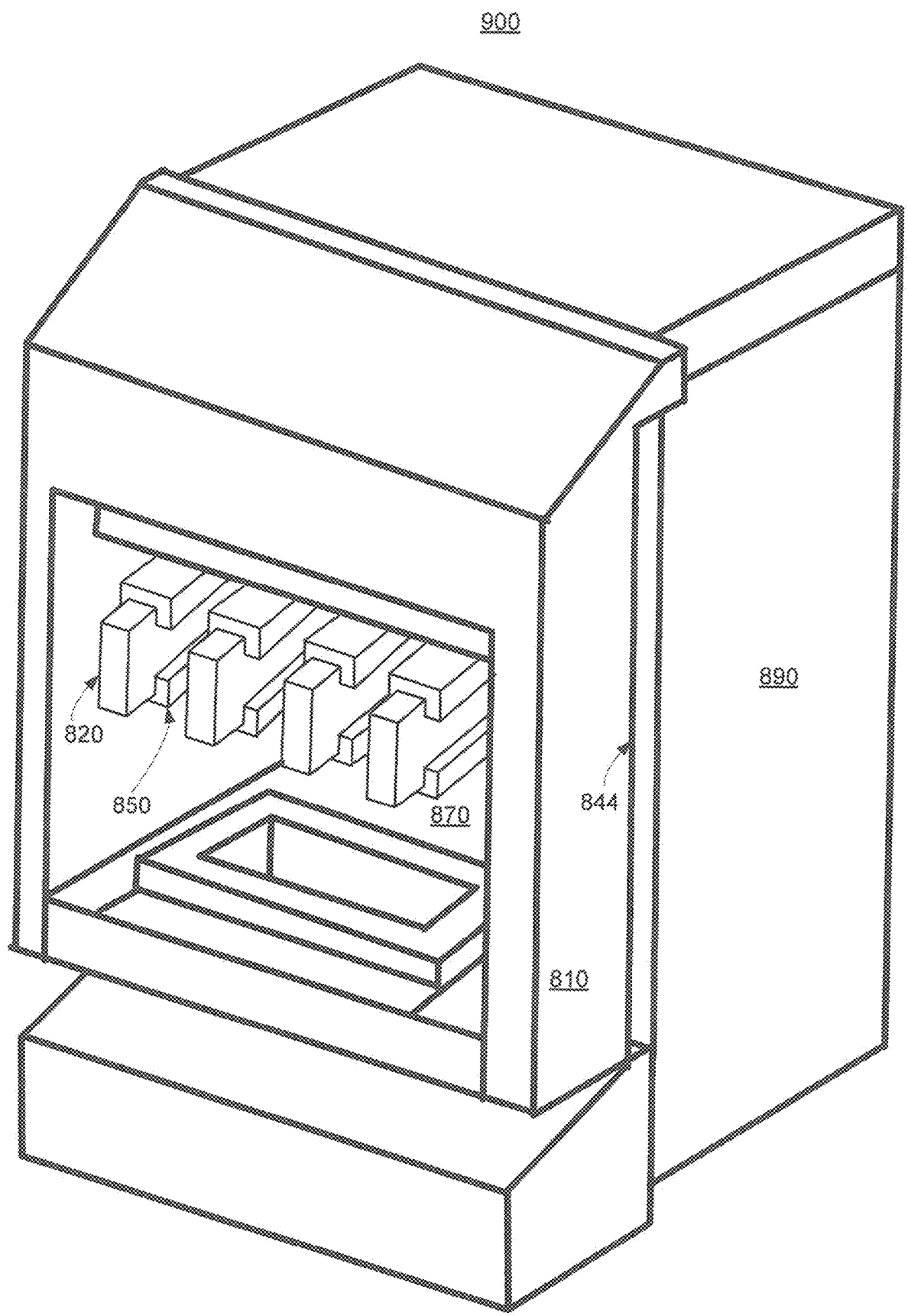
FIG. 6 is a block diagram of an exemplary test system in accordance with one embodiment.

In one embodiment, multiple-name-space testing systems and methods can be implemented in test systems similar to the embodiments shown in the FIGS. 4, 5, and 6.

FIG. 4 is a block diagram of an exemplary testing system 500 in accordance with one embodiment. Testing system 500 includes electronics compartment 510 and tester electronics 520, load board 530, DUTs 570, and testing chamber 590 with door 591. Electronics compartment 510 includes controller 511 and environment compartment 512.

It is appreciated that selectable testing systems and methods can be implemented in various testing system configurations or approaches. FIG. 5 is a block diagram of an exemplary testing system in accordance with one embodiment. It consists of a large controlled environmental chamber or oven 71 that contains an oven rack 10 and heating and cooling elements 11. The oven rack 10 contains devices under test (DUTs) in a number of load board trays 31, 32, 33, 34, 41, 42, 43, and 44. The environmental test chamber 71 has solid walls and a solid door 72 that enclose the test rack 10. The heating and cooling elements 11 can have a wide temperature range (e.g., −10 to 120 degrees C.). The tester or test head 81 contains various racked components, including system controller network switches 52, system power supply components 53, and tester slices 50 (the tester slice contains the tester electronics). The load board trays (e.g., 30, 31, etc.) are connected to tester slices 50 (multiple load board trays can be coupled to a single tester slice). There is also a block diagram of a tester tray 30 and devices under test (e.g., 91, 92, etc.). The load board trays are manually populated with devices under test. The full tester trays (e.g., 30, 31, etc.) are manually inserted into environmental chamber 71 and manually connected to the tester electronics (e.g., 50, 52, 53, etc.). This process can be labor intensive and cumbersome (e.g., the process requires opening the door 72 of the environmental chamber 71 and manually trying to insert the trays though the door 72 into the appropriate location).

In one embodiment, a test system includes device interface board and tester electronics that control testing operations. The tester electronics can be located in an enclosure which together are referred to as the primitive. The device interface board has a device under test access interface that allows physical manipulation of the devices under test (e.g., manual manipulation, robotic manipulation, etc.). A device under test can be independently manipulated physically with little or no interference or impacts on testing operations of another device under test. Device interface boards and their load boards can be conveniently setup to accommodate different device form factors. In one embodiment, load boards are configured with device under test interfaces and universal primitive interfaces. In one exemplary implementation, the device interface board can control an ambient environment of a device under test.

FIG. 6 is a block diagram of an exemplary test system 800 in accordance with one embodiment. Test system 800 includes a testing primitive 890 (e.g., containing the testing control hardware and power supply components for the devices under test, etc.) and a device interface board (DIB) 810 disposed in front of and coupled to the primitive 890. In one embodiment, the device interface board 810 is a partial enclosure. The load board is also coupled to and electrically interfaces with the primitive 890 to obtain power and high-speed electrical signals for testing the device under test 820. The device interface board can include air flow channels 844 that allow air flow to and from the device under test environment. The air flow channels 844 can include baffles. The device interface board 810 partial enclosure includes a device under test access interface 870 that enables easy physical access (e.g., unobstructed, unimpeded, etc.) to the devices under test. Environmental control components 811 and 814 control and maintain device under test ambient environmental conditions (e.g., temperature, air flow rate, etc.). The environmental control components can create an environmental envelope that prevents or mitigate interference from outside environmental conditions on the operations of devices under test. While access to test system 800 may be easier than test system 700, test system configuration adapters enable both supplemental operations and functional testing that still offers benefits associated with not requiring the expensive and time-consuming multiple moves of DUTs between separate test systems (unlike conventional test approaches).

While the invention has been described in conjunction with the preferred embodiments, it will be understood that they are not intended to limit the invention to these embodiments. On the contrary, the invention is intended to cover alternatives, modifications, and equivalents. The description is not intended to be exhaustive or to limit the invention to the precise forms disclosed, and obviously many modifications and variations are possible.

Thus, multiple-name-space test systems and methods can allow more devices to be tested in parallel. Multiple-name-space testing systems and methods allow numerous namespaces over multiple devices to be tested substantially in parallel. In one embodiment, a greater number of namespaces in devices (e.g., storage devices, memory devices, NVMe SSDs, etc.) can be tested at least in part concurrently or in parallel as compared to conventional approaches, thereby increasing throughput. The multiple-name-space testing systems and methods can compress overall test time which facilitates cost reductions. They can also allow test conditions to more closely approximate actual conditions (e.g., large data center conditions, etc.).

Some portions of the detailed descriptions are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are associated with the appropriate physical quantities and are merely convenient labels applied to these quantities. Unless specifically stated otherwise as apparent from the discussions, it is appreciated that throughout the present application, discussions utilizing terms such as "processing", "computing", "calculating", "determining", "displaying" or the like, refer to the action and processes of a computer system, or similar processing device (e.g., an electrical, optical, or quantum, computing device), that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

It is appreciated that embodiments of the present invention can be compatible and implemented with a variety of different types of tangible memory or storage (e.g., RAM, DRAM, flash, hard drive, CD, DVD, etc.). The memory or storage, while able to be changed or rewritten, can be considered a non-transitory storage medium. By indicating a non-transitory storage medium, it is not intended to limit characteristics of the medium, and can include a variety of storage mediums (e.g., programmable, erasable, nonprogrammable, read/write, read only, etc.) and "non-transitory" computer-readable media comprises all computer-readable media, with the sole exception being a transitory, propagating signal.

It is appreciated that the description includes exemplary concepts or embodiments associated with the novel approach. It is also appreciated that the listing is not exhaustive and does not necessarily include all possible implementation. The concepts and embodiments can be implemented in hardware, firmware, software, and so on. In one embodiment, the methods or process describe operations performed by various processing components or units. In one exemplary implementation, instructions, or directions associated with the methods, processes, operations etc. can be stored in a memory and cause a processor to implement the operations, functions, actions, etc.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents. The listing of steps within method claims do not imply any particular order to performing the steps, unless explicitly stated in the claim.

What is claimed is:

1. A multiple-name-space testing system comprising:
a load board configured to couple with a plurality of devices under test (DUTs);
test electronics configured to test the plurality of DUTs, wherein the test electronics are coupled to the load board;
a controller configured to direct testing of multiple-name-spaces across the plurality of DUTs at least in part in parallel, wherein the multiple-name-spaces are located in the plurality of DUTs and wherein the controller is coupled to the testing electronics, wherein the multiple-name-spaces are located in the plurality of DUTs and wherein persistent namespace resources are pre-allocated for activation as part of a power up and deactivation as part of power down respectively for the plurality of DUTs, and wherein the controller handles user introduced testing requirements, including indicating that a first namespace is to be tested with full field programmable gate array (FPGA) hardware acceleration and indicating s second namespace is to be tested normally; and
a namespace testing tracker configured to track testing of the plurality of DUTs, including the testing of the multiple-name-spaces across the plurality of DUTs at least in part in parallel.

2. A multiple-name-space testing system of claim 1 wherein the plurality of DUTs are Non-Volatile Memory Express (NVMe) solid state drive (SSD) devices.

3. A multiple-name-space testing system of claim 1 wherein the controller directs sets of namespaces testing in parallel.

4. A multiple-name-space testing system of claim 1, wherein multiple-name-spaces are tested in parallel across a plurality of devices.

5. A multiple-name-space testing system of claim 1, wherein up to 128 devices are tested at least in part simultaneously.

6. A multiple-name-space testing system of claim 1, wherein the namespace testing tracker can track and manage testing of multiple-name-spaces at a time per DUT.

7. A multiple-name-space testing system of claim 1 wherein the controller is configured to handle user introduced testing requirements that further complicate the tracking and management of the testing.

8. A multiple-name-space testing system comprising:
a load board configured to couple with a plurality of devices under test (DUTs);
test electronics configured to test the plurality of DUTs, wherein the test electronics are coupled to the load board;
a controller configured to direct testing of multiple-name-spaces across the plurality of DUTs at least in part in parallel, wherein directing the testing includes balancing interrupts from the plurality of DUTs based upon activities of the plurality of DUTs and number of processing cores available for testing operations, wherein the multiple-name-spaces are located in the plurality of DUTs and wherein persistent namespace resources are pre-allocated for activation as part of a power up and deactivation as part of power down respectively for the plurality of DUTs; and
a namespace testing tracker configured to track testing of the plurality of DUTs, including the testing of the multiple-name-spaces across the plurality of DUTs at least in part in parallel, wherein the namespace testing tracker includes intelligence configured to select namespaces for testing based on various factors, including characteristics of the namespaces and application of test features of test electronics.

9. A multiple-name-space testing method comprising:
configuring testing electronics to test the plurality of devices under test (DUTs), wherein the testing electronics are coupled to a load board;
directing testing of multiple-name-spaces across the plurality of DUTs at least in part in parallel, wherein the multiple-name-spaces are located in the plurality of DUTs, wherein the multiple-name-spaces are located in the plurality of DUTs and wherein persistent namespace resources are pre-allocated for activation as part of a power up and deactivation as part of power down respectively for the plurality of DUTs; and
tracking testing of the plurality of DUTs, including the testing of the multiple-name-spaces across the plurality of DUTs at least in part in parallel, wherein the tracking includes intelligence configured to select namespaces for testing based on various factors, including characteristics of the namespaces and application of test features of test electronics.

10. The multiple-name-space testing method of claim 9, wherein the plurality of DUTs are NVMe SSD devices.

11. The multiple-name-space testing method of claim 9, further comprising handling user introduced testing requirements, including indicating that a namespace is to be tested with full FPGA hardware acceleration while another namespace is tested normally.

12. The multiple-name-space testing method of claim 9, wherein the directing includes testing control based on differences in namespace characteristics.

13. The multiple-name-space testing method of claim 9, wherein the directing includes control for differences in sector size.

14. The multiple-name-space testing method of claim 9 wherein the directing includes control for differences in protection information.

15. A multiple-name-space testing system of claim 9, wherein the directing includes directing sets of namespaces testing in parallel.

16. A multiple-name-space testing system of claim 9, wherein multiple-name-spaces are tested in parallel across a plurality of devices.

17. A multiple-name-space testing system of claim 9, wherein overall test time is compressed.

18. A multiple-name-space testing system of claim 9, wherein directing includes application of test features of the test electronics to the plurality of DUTs.

19. A multiple-name-space testing system of claim 9, further comprising handling user introduced testing requirements that further complicate the tracking and management of the testing.

* * * * *